(12) United States Patent
Ito et al.

(10) Patent No.: US 7,534,979 B2
(45) Date of Patent: May 19, 2009

(54) PRESSURE-CONTACT TYPE RECTIFIER WITH CONTACT FRICTION REDUCER

(75) Inventors: Shinichi Ito, Tokyo (JP); Shigeki Maekawa, Tokyo (JP); Hiroya Ikuta, Tokyo (JP); Shigeharu Nagai, Tokyo (JP); Toshiaki Kashihara, Tokyo (JP); Shinji Iwamoto, Tokyo (JP); Takahiro Sonoda, Tokyo (JP)

(73) Assignee: Mitsubishi Denki Kabushiki Kaisha, Chiyoda-Ku, Tokyo (JP)

( * ) Notice: Subject to any disclaimer, the term of this patent is extended or adjusted under 35 U.S.C. 154(b) by 385 days.

(21) Appl. No.: 10/585,351

(22) PCT Filed: May 14, 2004

(86) PCT No.: PCT/JP2004/006877

§ 371 (c)(1),
(2), (4) Date: Jul. 6, 2006

(87) PCT Pub. No.: WO2005/112111

PCT Pub. Date: Nov. 24, 2005

(65) Prior Publication Data

US 2007/0139979 A1 Jun. 21, 2007

(51) Int. Cl.
*H05B 1/02* (2006.01)
(52) U.S. Cl. .................. 219/505; 219/501; 219/496; 363/53; 257/727
(58) Field of Classification Search ............. 219/494, 219/496, 501, 505, 209; 363/52, 53, 125; 257/785, 726, 727
See application file for complete search history.

(56) References Cited

U.S. PATENT DOCUMENTS

| | | | | |
|---|---|---|---|---|
| 3,581,163 | A * | 5/1971 | Eriksson | 257/688 |
| 5,506,452 | A | 4/1996 | Kuhnert | |
| 6,181,007 | B1 * | 1/2001 | Yamazaki et al. | 257/718 |
| 6,320,268 | B1 * | 11/2001 | Lang et al. | 257/785 |
| 6,380,622 | B1 | 4/2002 | Hirai et al. | |

FOREIGN PATENT DOCUMENTS

DE  15 14 483  A1  3/1970

(Continued)

OTHER PUBLICATIONS

European Search Report from corresponding European Application No. 04733151, mailed on Aug. 20, 2008.

*Primary Examiner*—Mark H Paschall
(74) *Attorney, Agent, or Firm*—Buchanan Ingersoll & Rooney PC

(57) ABSTRACT

An objective is to provide a pressure-contact type rectifier in which solder that increases the environmental load is not used, and neither burning nor breakage of a rectifying device occurs, even if temperature of the rectifying device increases due to current flowing or force towards outside the rectifying device is applied to a lead end, etc. By providing an electrically conductive friction reducer on at least one electrode face of the rectifying device, the temperature increase can be prevented, and the friction at the contact face can be reduced. Moreover, by providing a flexible portion on the lead end outside a cap, and fixing the flexible portion to the cap, the contact area between the lead and the rectifying device can be kept constant. As a result, a pressure-contact type rectifier in which neither burning nor breakage of the rectifying device occurs can be obtained.

4 Claims, 5 Drawing Sheets

FOREIGN PATENT DOCUMENTS

| | | |
|---|---|---|
| EP | 0 638 928 A | 2/1995 |
| GB | 1132748 | 11/1968 |
| JP | 43-8377 | 3/1943 |
| JP | 56-164557 | 5/1955 |
| JP | 05-093052 U | 12/1993 |
| JP | 6-216267 | 8/1994 |
| JP | 8-186188 | 7/1996 |
| JP | 2001-102400 | 4/2001 |
| JP | 2002-043491 | 2/2002 |

* cited by examiner

PRESSURE-CONTACT TYPE RECTIFIER WITH CONTACT FRICTION REDUCER

TECHNICAL FIELD

The present invention relates to large current rectifiers used in, for example, electrical components of a vehicle, and relates in detail to package configurations thereof.

BACKGROUND ART

In a conventional large current rectifier, a diode chip as a rectifying device has been fixed by low melting-point metal such as solder. However, because the usage of the solder including lead increases the environmental load, a solder-free system has been expected.

A rectifier having a solder-free structure is, for example, disclosed in Japanese Patent No. 3,198,693, in which the rectifier is composed of a metal stem having a male thread on the outer circumferential face thereof, a metal cap having a female thread on the inner circumferential face thereof, a lead terminal fixed to an insulator, and a diode chip provided on the stem, and by fitting the stem with the cap, one of the electrodes of the diode chip is electrically connected to the lead terminal, meanwhile the other electrode is connected to the stem. In such a conventional rectifier, solder excluding lead has been realized and utilized; however, a problem has been found that resistance increase, wire breakage, etc. of the diode chip occur in operation.

DISCLOSURE OF THE INVENTION

An objective of the present invention, which is made to solve the above described problem, is to provide a highly reliable pressure-contact type rectifier in which neither the resistance increase nor the wire breakage occurs during its operation.

The causes of the above described problems have been investigated by the inventors; as a result, it has been found that heat generates during the operation due to electrical contact resistance at the contact face either between the lead terminal and the diode chip or between the diode chip and the stem, which raises temperature of the lead terminal, the diode chip, and the system, and thus, at this moment, stress concentration occurs, due to friction, at each contact face in accordance with the difference of each thermal expansion coefficient of the materials. As a result, it has been found that the problems are induced, such as a electrical conductivity failure at the contact face either between the lead terminal and the diode chip or between the diode chip and the stem, burning of the diode chip due to the resistance increase accompanied by the electrical conductivity failure, or breakage of the diode chip due to the stress, which has encouraged the present invention.

A pressure-contact type rectifier according to a first aspect of the present invention is composed of a cap, a lead passing through the cap, supported by an elastic member, a case fittable to the cap, a rectifying device having electrodes, one of which for contacting an end of the lead and the other for contacting the case, and a friction reducer provided on at least one face of the electrodes, wherein the rectifying device is pressure-fixed by the cap and the case.

In such a pressure-contact type rectifier as described above, because the friction reducer, provided at the contact face either between the lead and the rectifying device or between the rectifying device and the case, relaxes the friction due to the temperature rise during the operation, and enables the stress concentration at the contact face to decrease, electrical conductivity failure and burning of the rectifying device due to the resistance increase accompanied by the electrical conductivity failure, or breakage of the rectifying device due to the stress, etc. do not occur; consequently, a highly reliable pressure-contact type rectifier can be obtained.

In such a way as this, in order to decrease the stress concentration in the friction reducer, the friction reducer may be deformed by the stress; therefore, it is preferable that the friction reducer is formed from electrically conductive microparticles. In order to improve the electrical conductivity at the contact face either between the lead and the rectifying device or between the rectifying device and the case, it is preferable that the microparticles are composed of at least one of materials including carbon, silver, copper, gold, aluminum, and molybdenum disulfide. Moreover, in order to simultaneously ensure the deformation amount and the electrical conductivity, it is preferable that the mean diameter of the microparticles be from 0.01 μm to 50 μm. Furthermore, when the mean diameter is too small, the friction reducer becomes too dense, so that the deformation amount becomes too low, on the other hand, when the mean diameter is too large, the electrical resistance becomes higher; therefore, the mean diameter of the microparticles is suitably from 0.05 μm to 20 μm; further, considering reliability, the diameter is more suitably from 0.1 μm to 10 μm.

A pressure-contact type rectifier according to a second aspect of the present invention is composed of a cap, a lead passing through the cap, supported by an elastic member, a case fittable to the cap, a rectifying device having electrodes, one of which for contacting an end of the lead and the other for contacting the case, and a friction reducer provided on at least one face of the electrodes, wherein the rectifying device is pressure-fixed by the cap and the case; and further, the reducer is composed of one or two soft members inserted into at least either a contact area between the rectifying device and the lead edge, or a contact area between the rectifying device and the case.

In such a pressure-contact type rectifier, when the cap is fitted to the case, the soft members are deformed, so that the contact areas can be increased with micro-irregularities on the contact faces between the lead and the rectifying device and between the case and the rectifying device being evened with the members; therefore, electrical and thermal conductivity between the lead and the rectifying device, and the rectifying device and the case can be improved.

A pressure-contact type rectifier according to a third aspect of the invention is composed of a cap, a lead passing through the cap, supported by an elastic member, a case fittable to the cap, a rectifying device having electrodes, one of which for contacting an end of the lead and the other for contacting the case, and a friction reducer provided on at least one face of the electrodes, wherein the rectifying device is pressure-fixed by the cap and the case; and further a flexible portion is provided on the lead outside the cap, as well as the lead is fixed to the cap.

In such a pressure-contact type rectifier as described above, because the flexible portion is provided on the lead, and the lead is fixed to the cap, even if a force is applied to the lead, acting thereupon outwardly and longitudinally along the lead, the flexible portion stretches so as to absorb the force, and displacement of the component parts provided inside the cap can be prevented; therefore, because the contact area between the lead and the rectifying device does not vary, a highly reliable pressure-contact type rectifier can be obtained in which neither resistance increase nor wire breakage occurs during the operation.

Moreover, a pressure-contact type rectifier according to a forth aspect of the invention is composed of a cap, a lead passing through the cap, supported by an elastic member, a case fittable to the cap, a rectifying device having electrodes, one of which for contacting to an end of the lead and the other for contacting the case, a friction reducer provided on at least one face of the electrodes, and threads, being fittable to each other, provided on the outer circumferential face of the cap and on the circumferential inner face of the case, wherein the rectifying device is pressure-fixed by the cap and the case with the threads being engaged.

In such a pressure-contact type rectifier, because a cap and a case are fitted by threads, members other than that are not needed in order to pressure-fix a rectifying device, thereby a pressure-contact type rectifier can be inexpensively manufactured.

BEST MODE FOR CARRYING OUT THE INVENTION

In order to explain in further detail the present invention, the invention is explained with reference to the attached figures.

Embodiment 1

Figure 1:
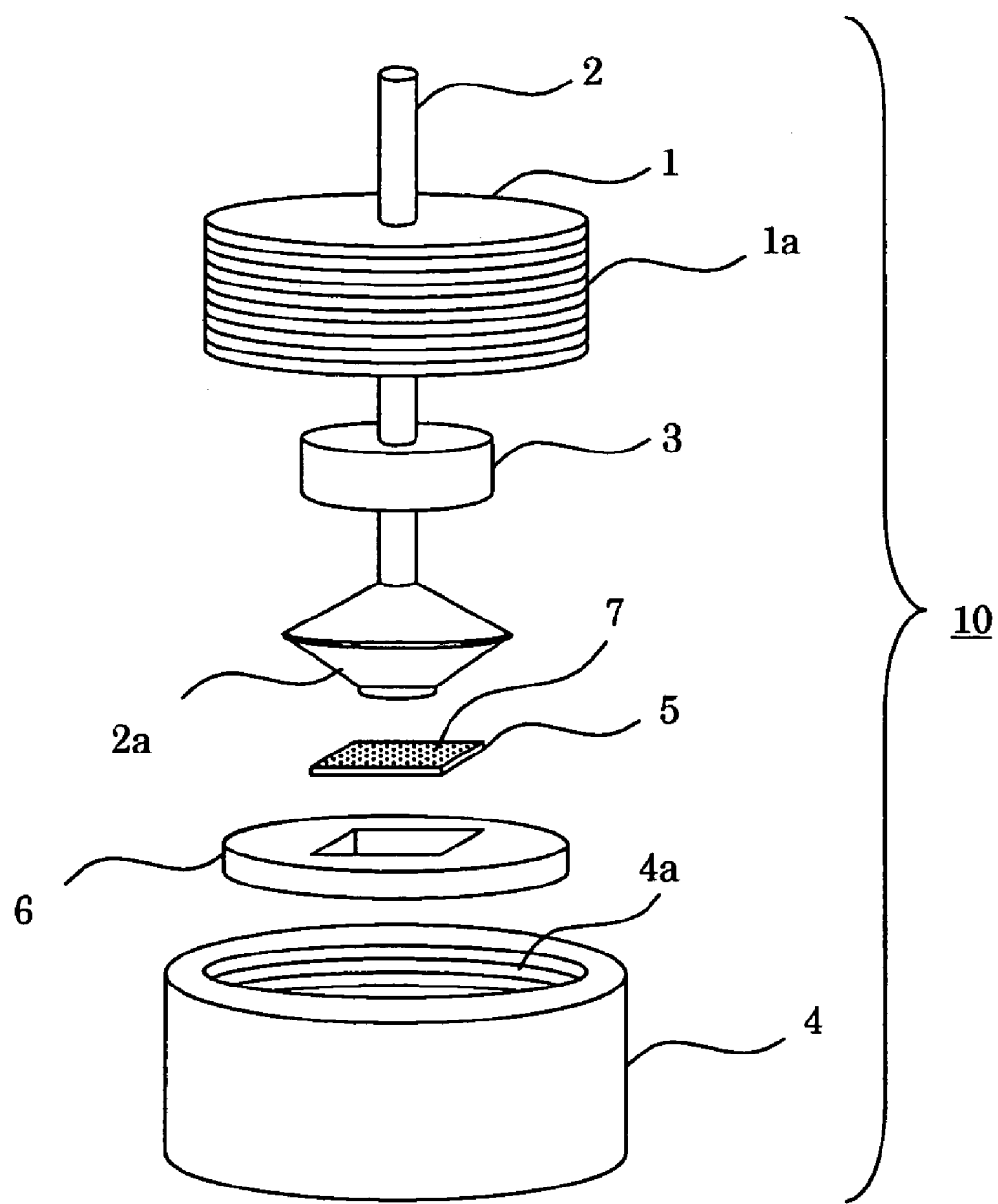
FIG. 1 is a schematic view illustrating a schematic configuration of a pressure-contact type rectifier in Embodiment 1 according to the present invention.

FIG. 1 is a schematic view illustrating a schematic configuration of a pressure-contact type rectifier 10 in Embodiment 1 for carrying out the present invention. In FIG. 1, a lead 2 passes through an insulating cap 1 having a male thread 1a on the outer circumferential face thereof, and is fixed to an insulating elastic member 3 that is made of, for example, silicone rubber. The bottom end of the lead 2 forms a lead terminal 2a whose lower face is flat and made of, for example, copper. Into a case 4, having a bottom, in which a female thread 4a that is fittable to the cap 1 is provided on the inner circumferential face thereof, a diode holder 6 whose center is cut away in order to position a diode chip 5 is inserted; thus, the diode chip 5 as a rectifying device is set in the cut-away portion. The case 4 is formed from, for example, copper having excellent electrical and thermal conductivity. The inner bottom face of the case 4, contacting the diode chip 5, is finished extremely flat in order to enlarge the area for contacting the diode chip 5. For example, pressing has been performed with a flat punch so as to induce a plastic flow; consequently, the flatness has been improved. The diode holder 6 is, for example, formed from PPS (poly (phenylene sulfide)) resin having highly electrical insulating and heat-resisting characteristics.

Figure 2:
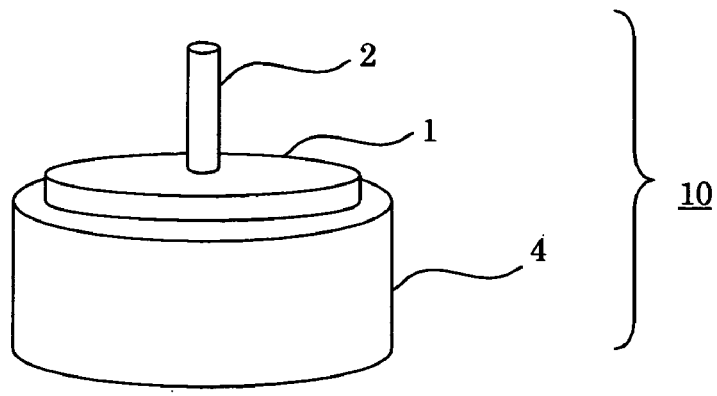
FIG. 2 is a schematic view illustrating the pressure-contact type rectifier in Embodiment 1 according to the present invention.

In the diode chip 5, the top and the bottom faces are used as electrodes, and evaporated carbon films as friction reducers 7 are formed on the faces. These evaporated carbon films are formed by vacuum evaporation using a resistance heating method; thus, the mean film thickness is approximately 10 $\mu$m. The evaporated carbon films having the above mean thickness are not normally formed of continuing films, but formed of stacked products that are constructed from microparticles whose mean diameter is approximately 1 $\mu$m. By fitting the male thread 1a into the female thread 4a to cramp the cap 1 to the case 4, the diode chip 5 is tightly pressure-contacted with the lead terminal 2a and the case 4 through the elastic member 3. FIG. 2 is a schematic view illustrating a configuration that is configured so as to operate as the pressure-contact type rectifier 10 by the cap 1 and the case 4 being fitted with their threads.

Figure 3:
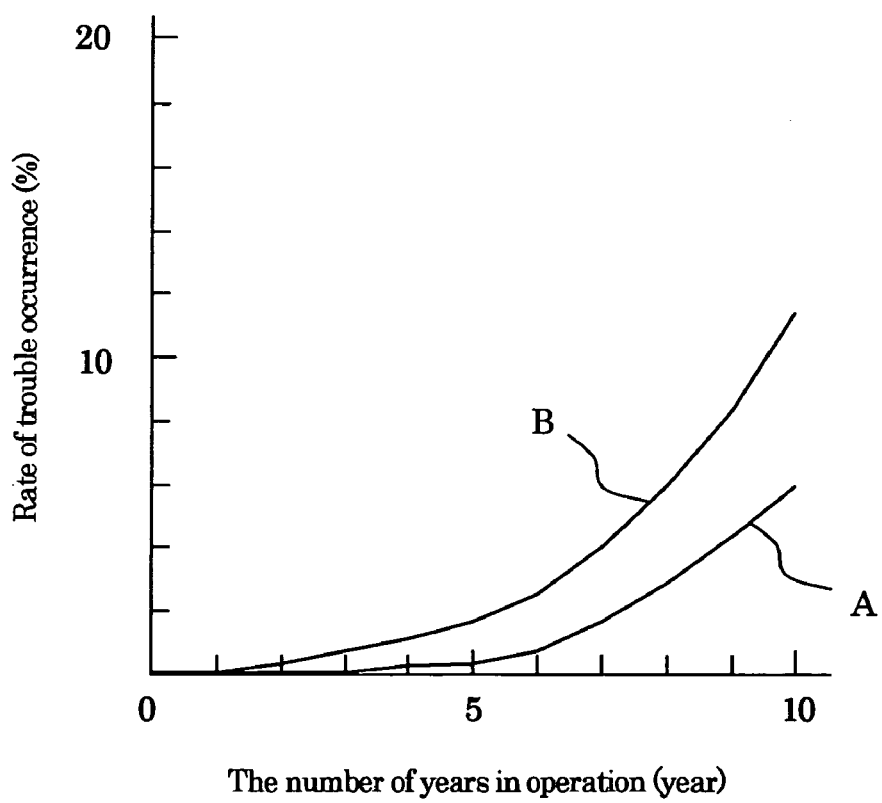
FIG. 3 is an explanatory view representing the reliability difference between a case in which friction reducers are provided and a case in which the friction reducers are not provided in Embodiment 1 according to the present invention.

In the pressure-contact type rectifier 10 configured such as above, even if temperature of the diode chip 5 and the members contacting the diode chip 5 rises due to the heat generated during the operation, and friction occurs on each contacting face of the lead terminal 2a, the diode chip 5, and the case 4, the friction reducers 7 can relax stress concentration that has occurred due to the friction. Specifically, due to moving or rotating of the microparticles of the evaporated carbon films that construct the friction reducers 7, strain on each contact face is relaxed. As a result, even though the operation is performed for a long period, a pressure-contact type rectifier can be obtained in which burning and the like of the diode chip 5 do not occur. FIG. 3 is an explanatory view representing the reliability difference between a case (A) in which the friction reducers 7 are formed and a case (B) in which the friction reducers 7 are not formed on the surfaces of the diode chip 5 in this embodiment. In FIG. 3, it is found that, by providing the friction reducers 7, the rate of trouble occurrence is decreased, so that the reliability of the pressure-contact type rectifier is improved.

Embodiment 2

In the above Embodiment 1, an example has been represented in which evaporated carbon films are formed as the friction reducers 7; however, in this embodiment, metal such as silver is evaporated as the friction reducers 7. The evaporated films are formed of stacked products that are constructed from microparticles whose mean diameter is 0.5 $\mu$m in such a way that the mean film thickness becomes approximately 5 $\mu$m. In the pressure-contact type rectifier 10 configured such as above, even if temperature of the diode chip 5 and the periphery of the diode chip 5 rises due to heat generated during its operation, and friction occurs on each contact face of the lead terminal 2a, the diode chip 5, and the case 4, due to movement of the silver microparticles that construct the friction reducers 7, the friction reducers 7 can relax stress concentration that has occurred due to the friction. As a result, even though an operation is performed for a long period, a pressure-contact type rectifier can be obtained in which burning and the like of the diode chip 5 do not occur.

Here, although the evaporated silver films have been used as the friction reducers 7 in this embodiment, at least one of materials such as copper, gold, aluminum, and molybdenum disulfide may be used as the evaporated films.

Embodiment 3

In above Embodiment 1, an example has been represented in which the friction reducers 7 are formed from evaporated carbon films whose mean diameter of the carbon particles is 1 μm, and whose mean film thickness is 10 μm; however, in this embodiment, the friction reducers 7 has been formed in which the mean diameter of the carbon particles is varied in the range from 0.005 μm to 10 μm, and a pressure-contact type rectifier has been completed; then, the rate of trouble occurrence with respect to its operation time has been measured. The mean film thickness of the friction reducers 7 has been set at 10 times as thick as the mean diameter of the particles. In an actual endurance test, in order to accelerate up to 10 times, by an applied voltage being set at 10 times as high as the voltage in the normal test, the rate of the trouble occurrence after one year operation has been assumed to be the rate of the trouble occurrence after ten-year operation.

Figure 4:
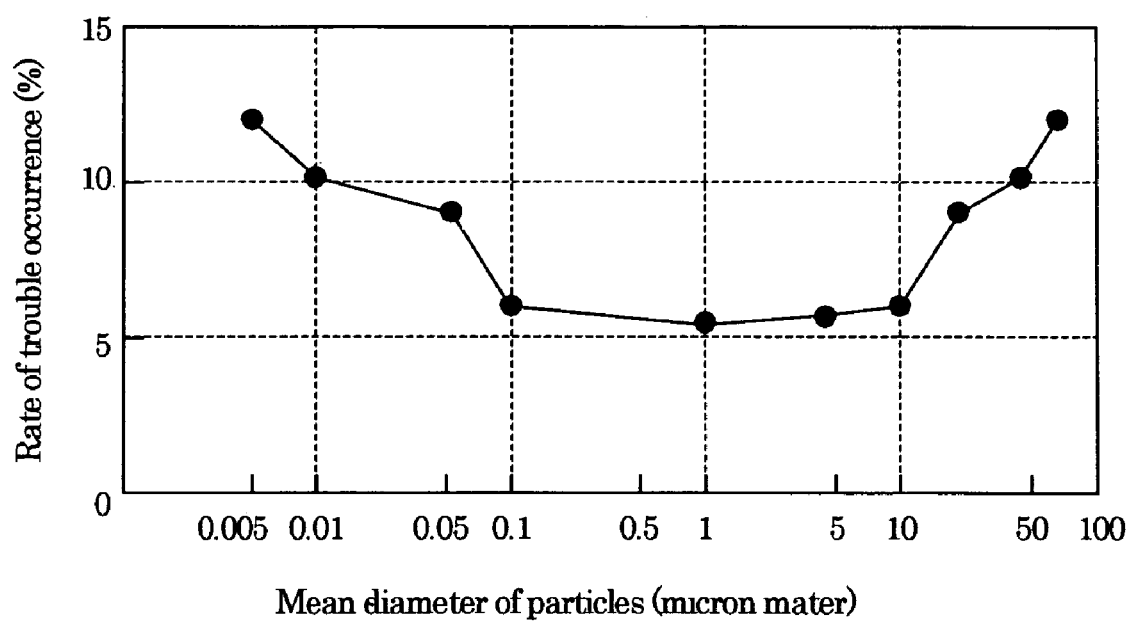
FIG. 4 is an explanatory view representing a relationship between mean particle diameters and the reliability in Embodiment 3 according to the present invention.

FIG. 4 is an explanatory view representing a relationship between the mean particle diameters and the rates of the trouble occurrence after ten-year operation. In the range from 0.01 μm to 50 μm of the mean particle diameter, the rate of the trouble occurrence becomes not higher than 10%; thus, the rate is improved from that of 12% without the friction reducers 7. Moreover, in the range from 0.05 μm to 20 μm of the mean particle diameter, the rate of the trouble occurrence becomes not higher than 8%; thus, reliability is further improved. Furthermore, in the range from 0.1 μm to 10 μm of the mean particle diameter, the rate of the trouble occurrence becomes not higher than 6%; thus, the rate is found to be further improved.

When the mean particle diameter is smaller than 0.01 μm, because the friction reducers 7 come into over-condensed states, and thus the particle movement for relaxing stress concentration due to the friction becomes difficult, breakage of the diode chip 5 becomes easy to occur, and therefore the rate of the trouble occurrence increases; on the other hand, when the mean particle diameter is larger than 50 μm, because the contact areas between the friction reducer 7 and the face of the lead 2, and between the diode chip 5 and the case 4 surface decrease, the contact resistance thereof increases, and heat generated during the operation increases, so that burning of the diode chip 5 becomes easy to occur; consequently, the rate of the trouble occurrence increases.

Embodiment 4

Figure 5:
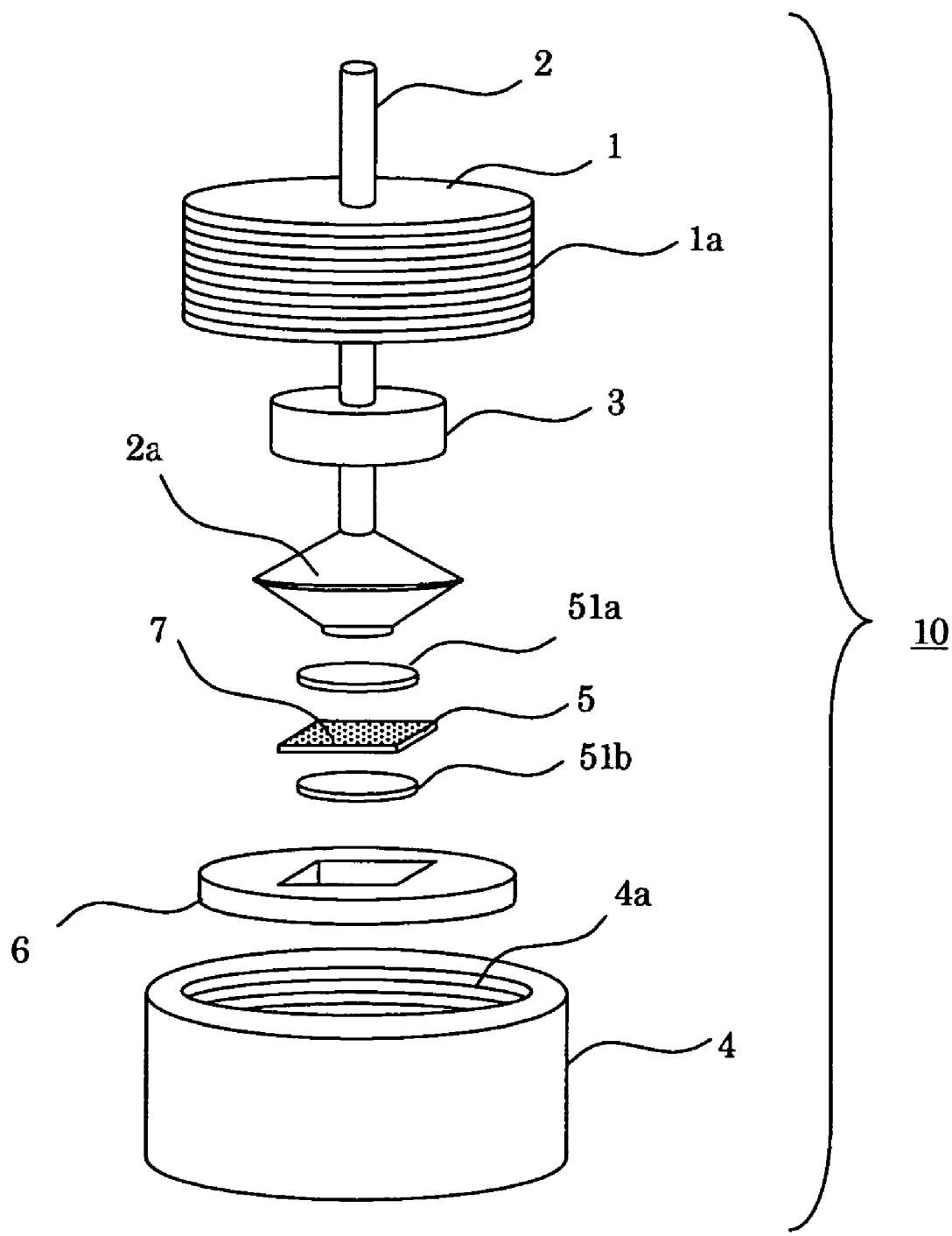
FIG. 5 is a schematic view illustrating a schematic configuration of a pressure-contact type rectifier in Embodiment 4 according to the present invention.

FIG. 5 is a schematic view illustrating a schematic configuration of a pressure-contact type rectifier 10 in Embodiment 4. In FIG. 5, the lead 2 passes through the insulating cap 1 having the male thread 1a on the outer circumferential face thereof. The lead 2 is fixed to the insulating elastic member 3 that is made of, for example, silicone rubber. The bottom end of the lead 2 forms the lead terminal 2a whose lower face is flat, and made of for example, copper. Into the case 4, having a bottom, in which the female thread 4a that is fittable to the cap 1 is provided on the inner circumferential face thereof, the diode holder 6 whose center is cut away inserted is in order to position the diode chip 5; thus, the diode chip 5 as a rectifying device is set in the cut-away portion. The case 4 is formed from, for example, copper having excellent electrical and thermal conductivity. The inner face, at the bottom of the case 4, contacting the diode chip 5, is finished extremely flat in order to enlarge the area for contacting the diode chip 5. For example, pressing has been performed with a flat punch so as to induce the plastic flow; consequently, the flatness has been improved. The diode holder 6 is, for example, formed from PPS resin having highly insulating and heat-resisting characteristics. Silver plates, for example, are inserted between the lead terminal 2a and the diode chip 5, and between the case 4 and the diode chip 5 as soft members 51a and 51b, respectively.

In the diode chip 5, the top and bottom faces are used as electrodes, and the evaporated carbon films as the friction reducers 7 are formed on the faces. These evaporated carbon films are formed by vacuum evaporation using a resistance heating method; thus, the mean film thickness is approximately 10 μm. By fitting the male thread 1a into the female thread 4a to cramp the cap 1 to the case 4, the diode chip 5 is tightly pressure-contacted with the lead terminal 2a and the case 4 via the elastic member 3; thereby, the pressure-contact type rectifier 10 is realized.

In the pressure-contact type rectifier 10 configured such as above, when the diode chip 5 is tightly pressure-contacted with the lead terminal 2a and the case 4, the soft members 51a and 51b are elastically deformed; consequently, microirregularities on the contact faces of the lead terminal 2a, the diode chip 5, and the holder cup 4 can be evened with the members. As a result, the contact area between the diode chip 5 and the lead terminal 2a, or between the diode chip 5 and the case 4 can be increased; thus, electrical and thermal conductivity can be improved.

Embodiment 5

Figure 6:
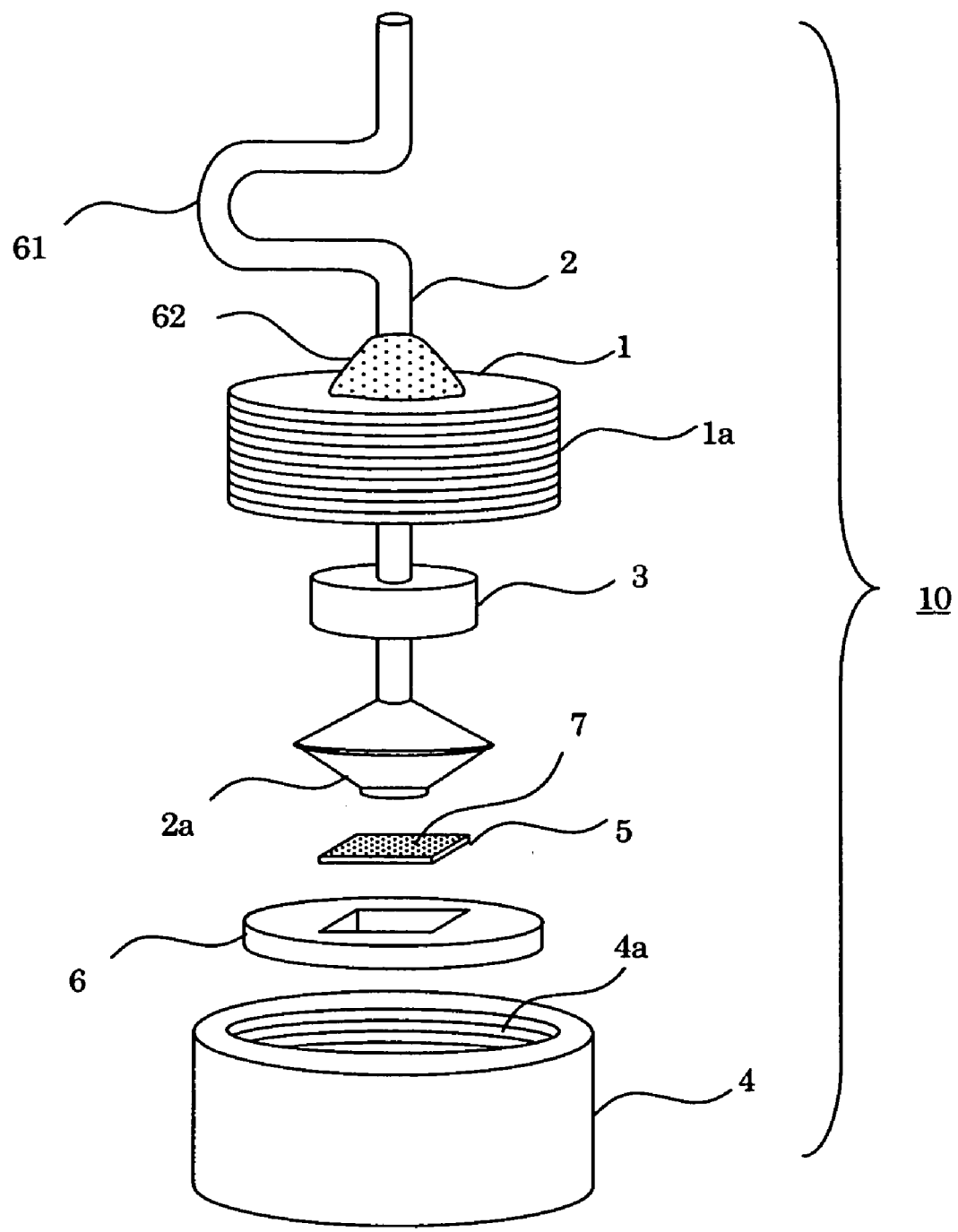
FIG. 6 is a schematic view illustrating a schematic configuration of a pressure-contact type rectifier in Embodiment 5 according to the present invention.

FIG. 6 illustrates a pressure-contact type rectifier 10 in Embodiment 6. In FIG. 6, the lead 2 passes through the insulating cap 1 having the male thread 1a on the outer circumferential face thereof. The lead 2 is fixed to the insulating elastic member 3 that is made of, for example, silicone rubber. A flexible part 61 is provided on the lead 2 on the upper side of the cap. The flexible part 61 has, for example, a structure in which the lead 2 is bent in U-shape. The bottom of the lead 2 is the lead terminal 2a whose lower face is flat, and made of, for example, copper. Into the case 4, having a bottom, in which the female thread 4a that is fittable with the cap 1 is provided on the inner circumferential face thereof, the diode holder 6 whose center is cut away is inserted in order to position the diode chip 5; thus, the diode chip 5 is set in the cut-away portion. The case 4 is formed from, for example, copper having excellent electrical and thermal conductivity. The inner bottom face of the case 4, contacting the diode chip 5 is finished extremely flat in order to enlarge the area for contacting the diode chip 5. For example, pressing has been performed with a flat punch so as to induce the plastic flow; consequently, the flatness has been improved. The diode holder 6 is, for example, formed from PBT (poly (butylene terephthalate)) resin having highly electrical insulating and heat-resisting characteristics.

In the diode chip 5, the top and the bottom faces thereof are used as electrodes, and evaporated carbon films as friction reducers are formed on the faces. These evaporated carbon films are formed by vacuum evaporation using the resistance heating method; thus, the mean film thickness is approximately 10 μm. By fitting the male thread 1a into the female thread 4a to cramp the cap 1 to the case 4, the diode chip 5 is tightly pressure-contacted with the lead terminal 2a and the case 4 via the elastic member 3. After that process, using an insulating adhesive 62, the lead 2 is fixed to the cap 1. As the adhesive, epoxy resin and the like can be used. In the pressure-contact type rectifier 10 configured such as above, even if a force is applied to the lead 2 to pull it upward along the lead, the flexible part 61 is deformed, and absorbs the force; consequently, displacement of the component parts provided lower than the cap 1 can be prevented. As a result, because it can be prevented that the contact area between the lead terminal 2a and the diode chip 5 decreases, a highly reliable pressure-contact type rectifier can be obtained in which neither resistance increase nor wire breakage occurs during its operation.

Here, in Embodiment 1-Embodiment 5, examples have been represented in which the male thread is formed on the outer circumferential face of the cap, while the female thread that is fittable with the male thread is formed on the inner circumferential face of the case; however, as long as the threads are fittable with the other, the male or the female of the threads may be inverted. Moreover, using a mechanism other than screwing, for example, using pressure cramp, the cap may be fitted with the case.

In Embodiment 1 and Embodiment 2, examples have been represented in which the friction reducers are formed by evaporation; however, using other methods such as that suspension in which powder microparticles are dispersed in a solution is applied onto the reducers and then dried so as to form the friction reducers.

Moreover, in Embodiment 4, an example has been represented in which silver plates have been used as the soft members; however, an electrically conductive and flexible material such as a metal including copper, aluminum or the like, or electrically conductive rubber may be also used as the soft members. Here, in Embodiment 5, an example has been represented in which the flexible part of the lead has the bent structure; however, other flexible structures such as a spring structure or a cylindrical structure may be also used.

Furthermore, in Embodiment 1-Embodiment 5, explanations are carried out using the diode chip as the rectifying device; however, other chips whose electrical operations are the same as the diode chip, such as a rectifying device to which, for example, an MOS-FET is applied, may be used instead of the diode chip.

INDUSTRIAL APPLICABILITY

As described above, the pressure-contact type rectifier according to the present invention is suitable to vehicle-use electrical components that are operated with large current.

What is claimed is:

1. A pressure-contact type rectifier comprising:
    a cap;
    a lead passing through the cap and supported by an elastic member;
    a case fittable to the cap;
    a rectifying device having electrodes, one of the electrodes contacting an end of the lead and the other electrode contacting the case, and the rectifying device being pressure-fixed by the cap and the case; and
    a friction reducer provided on at least one face of the electrodes, wherein the friction reducer is composed of carbon microparticles having a mean diameter from 0.1 μm to 10 μm.

2. A pressure-contact type rectifier as recited in claim 1, further comprising a soft member inserted into at least either the area of contact between the rectifying device and the lead end and between the rectifying device and the case.

3. A pressure-contact type rectifier as recited in claim 1, wherein a flexible portion is provided in the lead outside the cap and the lead is fixed to the cap.

4. A pressure-contact type rectifier as recited in claim 1, wherein an outer circumferential face of the cap and an inner circumferential surface of the case are threaded and the rectifying device is pressure-fixed by threadingly engaging the cap with the case.

* * * * *